(12) United States Patent
Chen (10) Patent No.: US 8,209,853 B2
(45) Date of Patent: Jul. 3, 2012

(54) REWORK SOLDERING JIG

(75) Inventor: Ching Shun Chen, Taipei (TW)

(73) Assignee: Inventec Corporation, Taipei (TW)

( * ) Notice: Subject to any disclaimer, the term of this patent is extended or adjusted under 35 U.S.C. 154(b) by 2 days.

(21) Appl. No.: 12/906,765

(22) Filed: Oct. 18, 2010

(65) Prior Publication Data

US 2011/0296677 A1  Dec. 8, 2011

(30) Foreign Application Priority Data

Jun. 2, 2010 (TW) ............................... 99117836 A (51) Int. Cl.
*H05K 13/00* (2006.01)

(52) U.S. Cl. .............. 29/762; 29/729; 29/747; 269/286; 269/903; 228/212

(58) Field of Classification Search .................... 29/729, 29/739, 740–742, 840–842, 755–764; 228/212, 228/56.2; 269/286, 903, 49.1

See application file for complete search history.

(56) References Cited

U.S. PATENT DOCUMENTS

| | | | |
|---|---|---|---|
| 1,587,429 A * | 6/1926 | Seib ................................. | 29/464 |
| 3,800,408 A * | 4/1974 | Schimmer et al. ............. | 228/212 |
| 5,784,774 A * | 7/1998 | Kajiwara ........................ | 29/758 |
| 7,591,065 B2 * | 9/2009 | Chen ............................... | 29/729 |
| 2011/0296677 A1 * | 12/2011 | Chen ............................... | 29/762 |

FOREIGN PATENT DOCUMENTS

| | | | |
|---|---|---|---|
| JP | 4-122055 | * | 4/1992 |
| JP | 10-84183 | * | 3/1998 |
| TW | M254043 | | 12/2004 |

* cited by examiner

*Primary Examiner* — Minh Trinh
(74) *Attorney, Agent, or Firm* — Morris Manning & Martin LLP; Tim Tingkang Xia, Esq.

(57) ABSTRACT

A rework soldering jig is used for heating a surface mounted slot. The rework soldering jig includes a body and an assembly frame. The assembly frame is detachably disposed on the body. The body and the assembly frame together wrap the surface mounted slot. Since the rework soldering jig has the detachable assembly frame, a size thereof can be adjusted according to different forms of slots.

8 Claims, 13 Drawing Sheets

REWORK SOLDERING JIG

CROSS-REFERENCE TO RELATED APPLICATIONS

This non-provisional application claims priority under 35 U.S.C. §119(a) on Patent Application No(s). 099117836 filed in Taiwan, R.O.C. on Jun. 2, 2010, the entire contents of which are hereby incorporated by reference.

BACKGROUND OF THE INVENTION

1. Field of Invention

The present invention relates to a rework soldering jig, and more particularly to a rework soldering jig with an adjustable size.

2. Related Art

In order to solder many electronic elements on a circuit board with a limited area to enhance an integration level of a product, it is common to solder the electronic elements on the circuit board by using a surface mounting technology (SMT) instead of a conventional technology of soldering electronic elements by plating through holes (PTH).

Taking a surface mounted dual in-line memory module slot (hereinafter referred to as a module slot) as an example, pins of module slots are mainly placed on solder points printed with a tin paste on the circuit board, and then a conveyor guides the circuit board through a reflow oven, so as to perform a step of heating and reflow soldering. In this way, each module slot can be securely electrically connected to the solder points on the circuit board after reflow soldering.

However, in practically applications, module slots having poor or void soldering have to be removed one by one from the circuit board after strict examination, the tin paste must be recoated on the solder points, and a rework soldering step of the module slots is then performed, so as to solder the module slots on the circuit board again. A rework soldering jig is adopted for conventional methods in the electronic industry for detaching and pulling out the module slot having poor soldering or void soldering for rework. By implementing the rework soldering jig, the module slot can be rapidly and conveniently detached from the circuit board without worrying that the module slot is damaged and unable to be reused. The rework soldering jig has an air inlet pipe, an air outlet plate, and a heating tank. The methods in the prior art are to connect the air inlet pipe of the rework soldering jig to a hot air blow pipe, and cover the air outlet plate on the module slot, so that the module slot is located in the heating tank. The hot air blow pipe supplies hot air to the heating tank through the air inlet pipe to evenly heat the module slot, and the module slot can be easily detached and pulled out when tin solder reaches the melting point.

Since the conventional rework soldering jig cannot adjust the size of the heating tank, and the module slot is generally not limited to only a single size and form, if the size of the module slot does not match that of the heating tank of the rework soldering jig, peripheral electronic components are usually heated or unevenly heated resulting in damages, thus causing low rework efficiency.

Therefore, in order to cater to the rework process of module slots having different forms without compromising the operation quality of rework disordering, multiple sets of rework soldering jigs matching various types of module slots need to be designed and manufactured. However, the manufacturing of multiple sets of rework soldering jigs causes problems that the fabrication cost is too high and the numerous rework soldering jigs occupy too much space.

SUMMARY OF THE INVENTION

Accordingly, the present invention is directed to a rework soldering jig, so as to solve problems such as low rework efficiency caused by that a conventional rework soldering jig is not completely applicable to module slots of different specifications and sizes, and excessively high fabrication cost as well as occupation of too much storage space as multiple sets of rework soldering jigs must be designed and manufactured to match different forms of module slots.

In an embodiment, the present invention provides a rework soldering jig, which heats a surface mounted slot with a hot air stream, so as to remove the surface mounted slot from a circuit board.

The rework soldering jig comprises a body and at least one assembly frame. The body has an air inlet pipe and an air outlet plate. The air inlet pipe has at least one air inlet, and the hot air stream enters through the air inlet. The air outlet plate is connected to the air inlet pipe, and has a run-through body heating tank. The body heating tank is disposed on the other side edge opposite to the air inlet pipe, and is in communication with the air inlet, so that the hot air stream is blown from the body heating tank to the surface mounted slot. The assembly frame is detachably disposed on the body. The assembly frame has a run-through frame heating tank which is in communication with the body heating tank. The body heating tank and the frame heating tank together wrap the surface mounted slot.

The rework soldering jig according to an embodiment of the present invention may further have two assembly frames respectively disposed at two opposite ends of the body heating tank.

In the rework soldering jig according to an embodiment of the present invention, the body may further have a body assembly hole, and the assembly frame may have a frame assembly hole. A fastening member passes through the frame assembly hole and the body assembly hole to fix the body and the assembly frame to each other.

In the rework soldering jig according to an embodiment of the present invention, the body may further have a plurality of body assembly holes, and the assembly frame may have a frame assembly hole. A fastening member passes through the frame assembly hole and one of the body assembly holes to fix the body and the assembly frame to each other.

In the rework soldering jig according to an embodiment of the present invention, the body may further have a body assembly hole, and the assembly frame may also have a plurality of frame assembly holes. A fastening member passes through one of the frame assembly holes and the body assembly hole to fix the body and the assembly frame to each other.

In the rework soldering jig according to an embodiment of the present invention, a size of an outer frame of the assembly frame is larger than that of an end face of the body, so that the assembly frame may be installed outside the body.

In the rework soldering jig according to an embodiment of the present invention, a size of an outer frame of the assembly frame is smaller than that of an end face of the body, so that the assembly frame may be accommodated inside the body.

In the rework soldering jig according to an embodiment of the present invention, the assembly frame may further have an expansion portion, and the expansion portion has an expansion tank. The expansion tank is in communication with the frame heating tank. The body heating tank, the frame heating tank, and the expansion tank together wrap the surface mounted slot.

The efficacy of the present invention lies in that, assembly frames of different sizes and forms can be freely assembled or dissembled on the body of the rework soldering jig, so that a shape of a combination tank formed by the body heating tank and the outer frame heating tank after the body and the assembly frame are assembled can be changed. In this way, the rework soldering jig can indeed match surface mounted slots of various forms and sizes, thereby improving the rework efficiency.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1A:
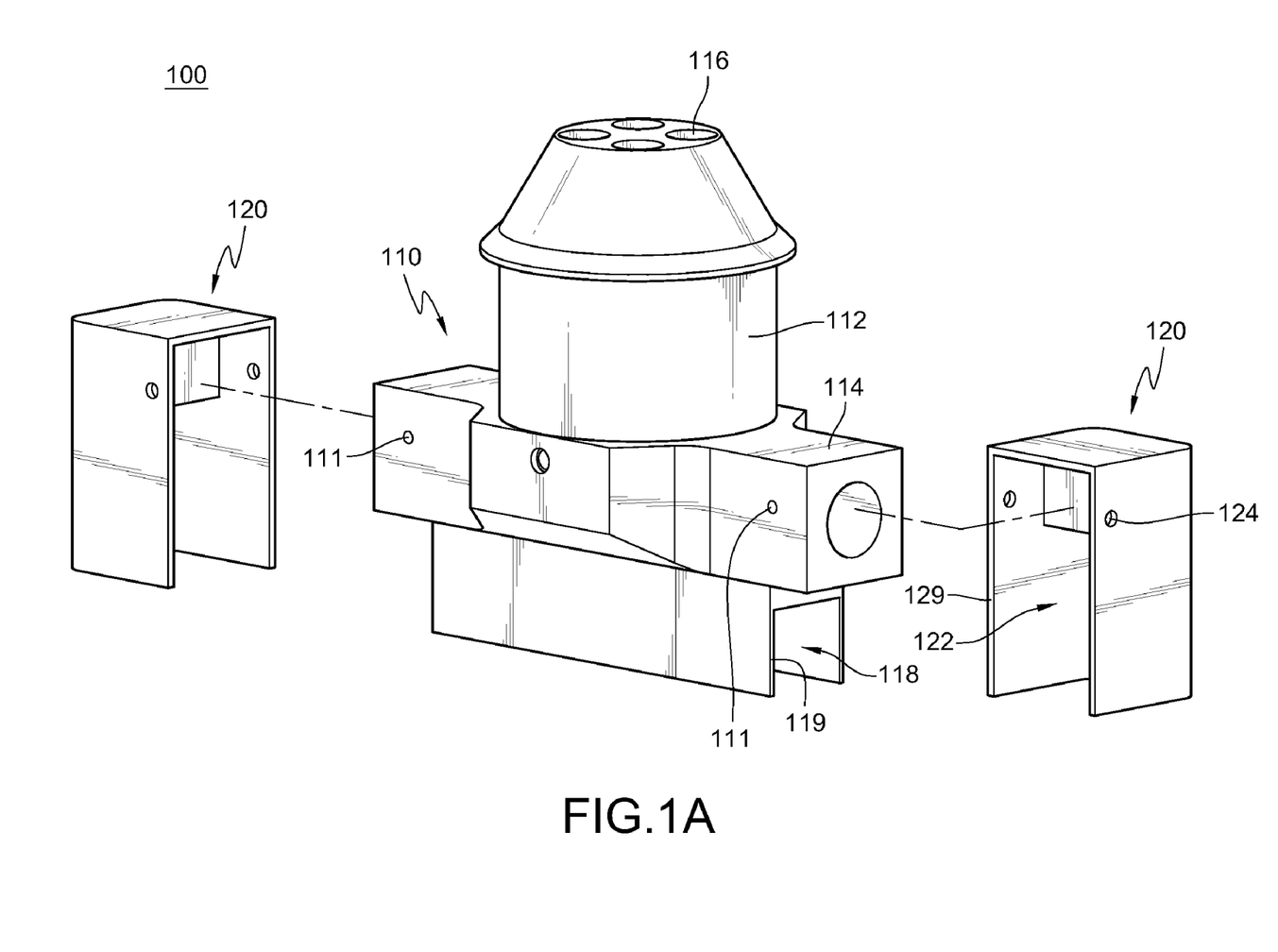
FIG. 1A is a structural view of elements of a rework soldering jig according to a first embodiment of the present invention.
Figure 1B:
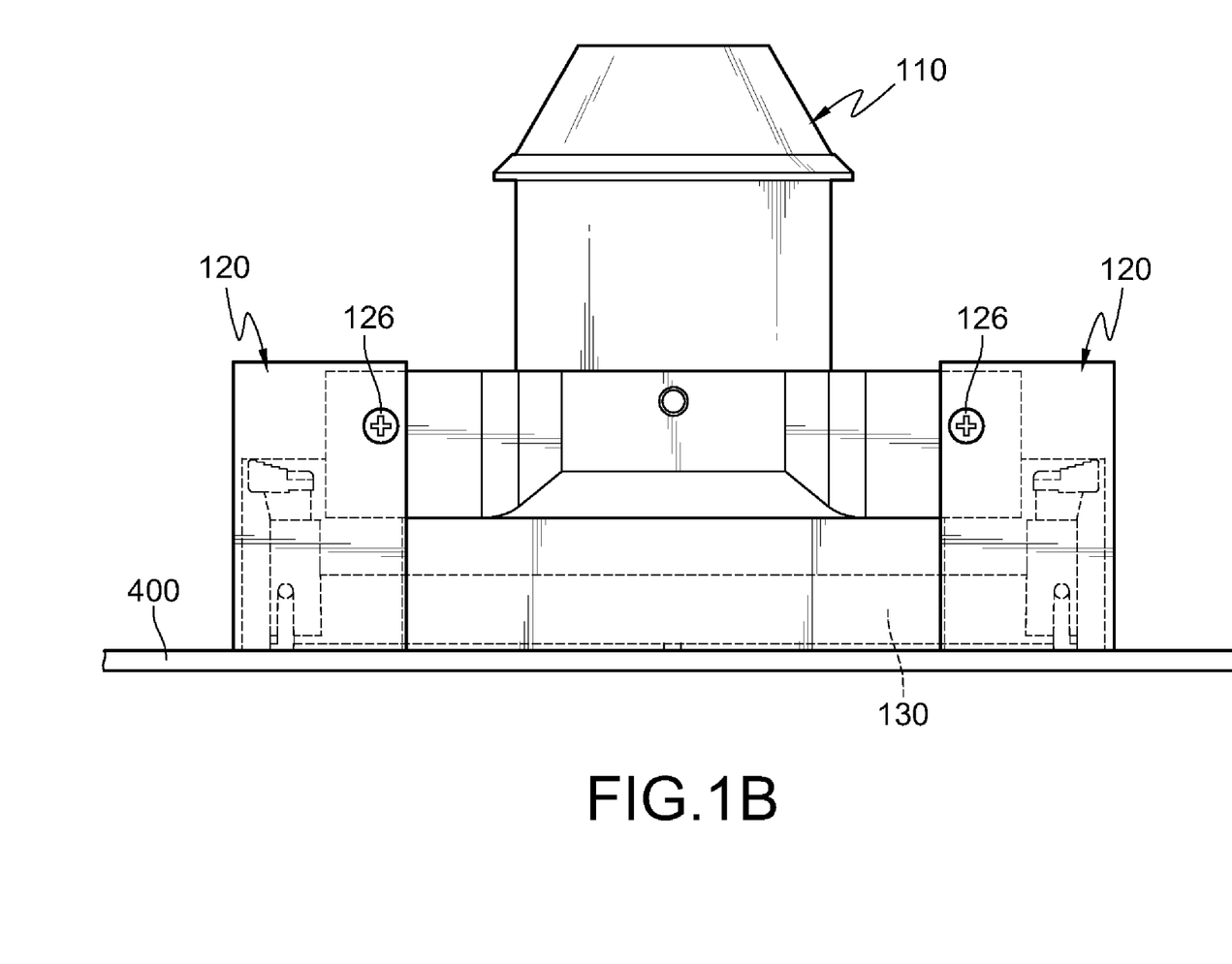
FIG. 1B is a plan assembly view of the rework soldering jig matching a first type of slot according to the first embodiment of the present invention.
Figure 1C:
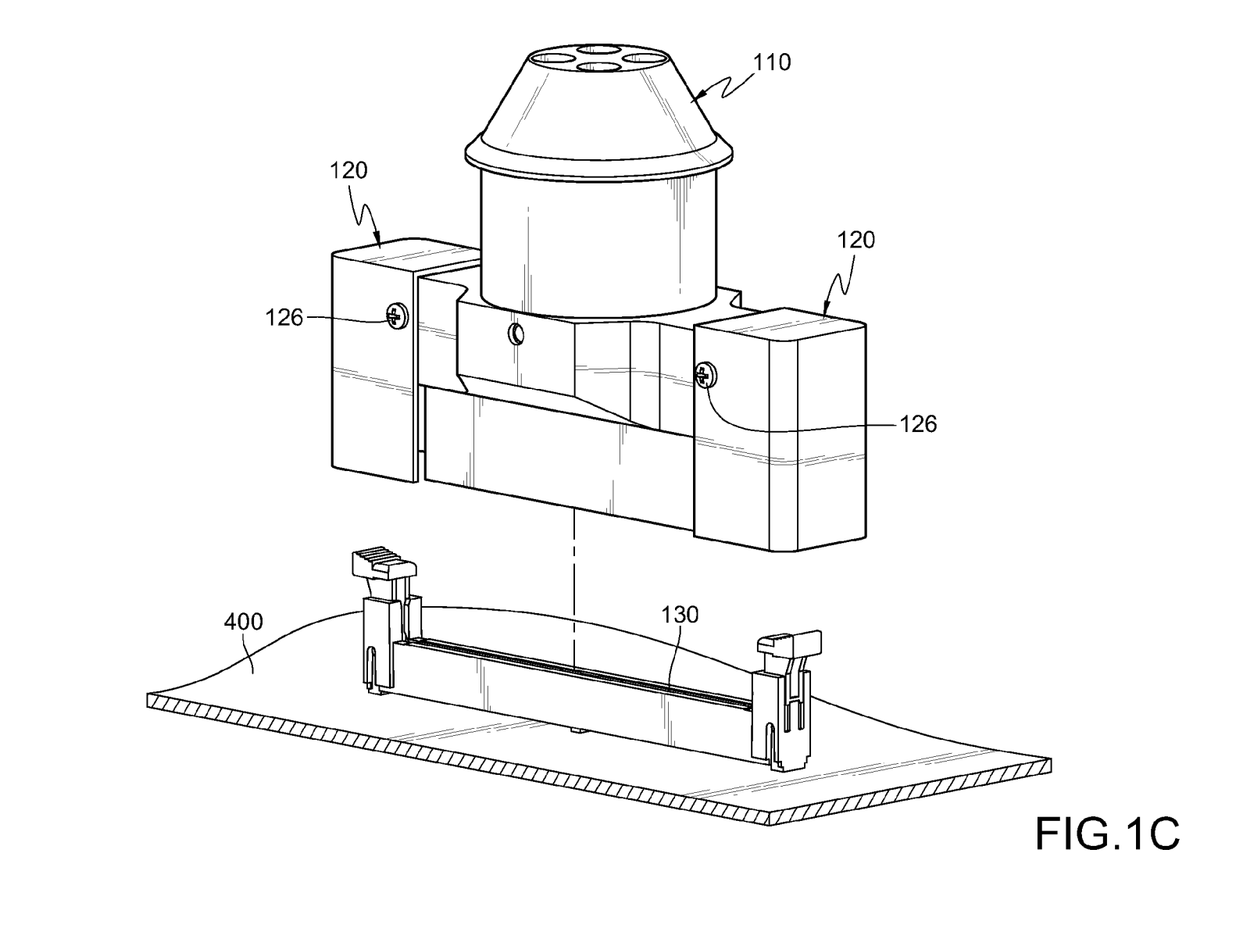
FIG. 1C is a three-dimensional assembly view of the rework soldering jig matching the first type of slot according to the first embodiment of the present invention.

FIGS. 1A to 1C are a structural view of elements and plan and three-dimensional assembly views of a rework soldering jig 100 according to a first embodiment of the present invention. The rework soldering jig 100 functions to heat a surface mounted slot with a hot air stream so as to remove the surface mounted slot from a circuit board 400. Since various forms of surface mounted slots exist, for convenience, an example of the rework soldering jig 100 matching a first type of slot 130 is taken for illustration in this embodiment. The first type of slot 130 is an ordinary vertical surface mounted slot.

The rework soldering jig 100 comprises a body 110 and a pair of assembly frames 120. The body 110 has an air inlet pipe 112 and an air outlet plate 114. The air inlet pipe 112 has at least one air inlet 116, and the hot air stream enters through the air inlet 116. The air outlet plate 114 is connected to the air inlet pipe 112, and has a body heating tank 118. The body heating tank 118 is disposed on the other side edge opposite to the air inlet pipe 112, and runs through two opposite ends of the air outlet plate 114. The body heating tank 118 is used for wrapping the first type of slot 130, and is in communication with the air inlet 116.

The assembly frame 120 is detachably disposed on two opposite side edges of the body 110. The assembly frame 120 has a frame heating tank 122 running through one end of the assembly frame 120. The frame heating tank 122 is used for wrapping the first type of slot 130, and the body heating tank 118 and the frame heating tank 122 are in communication with each other.

In addition, a body assembly hole 111 may further be opened on the body 110, a frame assembly hole 124 is also opened on the assembly frame 120, and the body assembly hole 111 matches the frame assembly hole 124. In addition, the body 110 has an end face 119 which is located on the body 110 and faces the assembly frame 120, while the assembly frame 120 has an outer frame 129 which is an outer contour of the assembly frame 120 and faces the end face 119 of the body 110. A size of the outer frame 129 of the assembly frame 120 is larger than that of the end face 119 of the body 110, so that the two assembly frames 120 can wrap two ends of the body 110. A fastening member 126, for example, a screw, may pass through the frame assembly hole 124 and the body assembly hole 111, so that the body 110 and the assembly frame 120 are fastened together, and the assembly frame 120 can be fixed outside the body 110 without falling off.

In addition, by assembling and fixing the body 110 and the two assembly frames 120, the body heating tank 118 and the frame heating tank 122 form a combination tank which can match a length×width size and a form of the first type of slot 130, so that the first type of slot 130 is exactly wrapped by the body heating tank 118 and the frame heating tank 122 together.

At this time, the hot air stream enters through the air inlet 116 of the air inlet pipe 112, and is blown to the first type of slot 130 wrapped by the body heating tank 118 and the frame heating tank 122, so as to heat the first type of slot 130, thereby removing the first type of slot 130 from the circuit board 400.

FIGS. 2A to 2E are a structural view of elements and plan and three-dimensional assembly views of a rework soldering jig 200 according to a second embodiment of the present invention. In this embodiment, the rework soldering jig 200 matching a second type of slot 230 and matching a third type of slot 240 respectively is taken as an example for illustration. The second embodiment is similar to the first embodiment in structure, and thus differences in structure will be described in detail. The second type of slot 230 and the third type of slot 240 are ordinary horizontal surface mounted slots, and the third type of slot 240 is longer than the second type of slot 230.

The rework soldering jig 200 comprises a body 210 and a pair of assembly frames 220. The body 210 has a body heating tank 218 for wrapping the second type of slot 230 or the third type of slot 240.

The assembly frame 220 has a frame heating tank 222 for wrapping the second type of slot 230 or the third type of slot 240, and the body heating tank 218 and the frame heating tank 222 are in communication with each other. The assembly frame 220 may further have an expansion portion 228, and the expansion portion 228 has an expansion tank 227. The expansion tank 227 is used for wrapping the second type of slot 230 or the third type of slot 240, and in communication with the frame heating tank 222.

In addition, a first body assembly hole 211 and a second body assembly hole 213 arranged horizontally may further be opened on the body 210, while a frame assembly hole 224 is also opened on the assembly frame 220, and the first body assembly hole 211 and the second body assembly hole 213 may match the frame assembly hole 224 respectively. A size of an outer frame 229 of the assembly frame 220 is larger than that of an end face 219 of the body 210, so that the two assembly frames 220 can wrap two ends of the body 210.

Figure 2A:
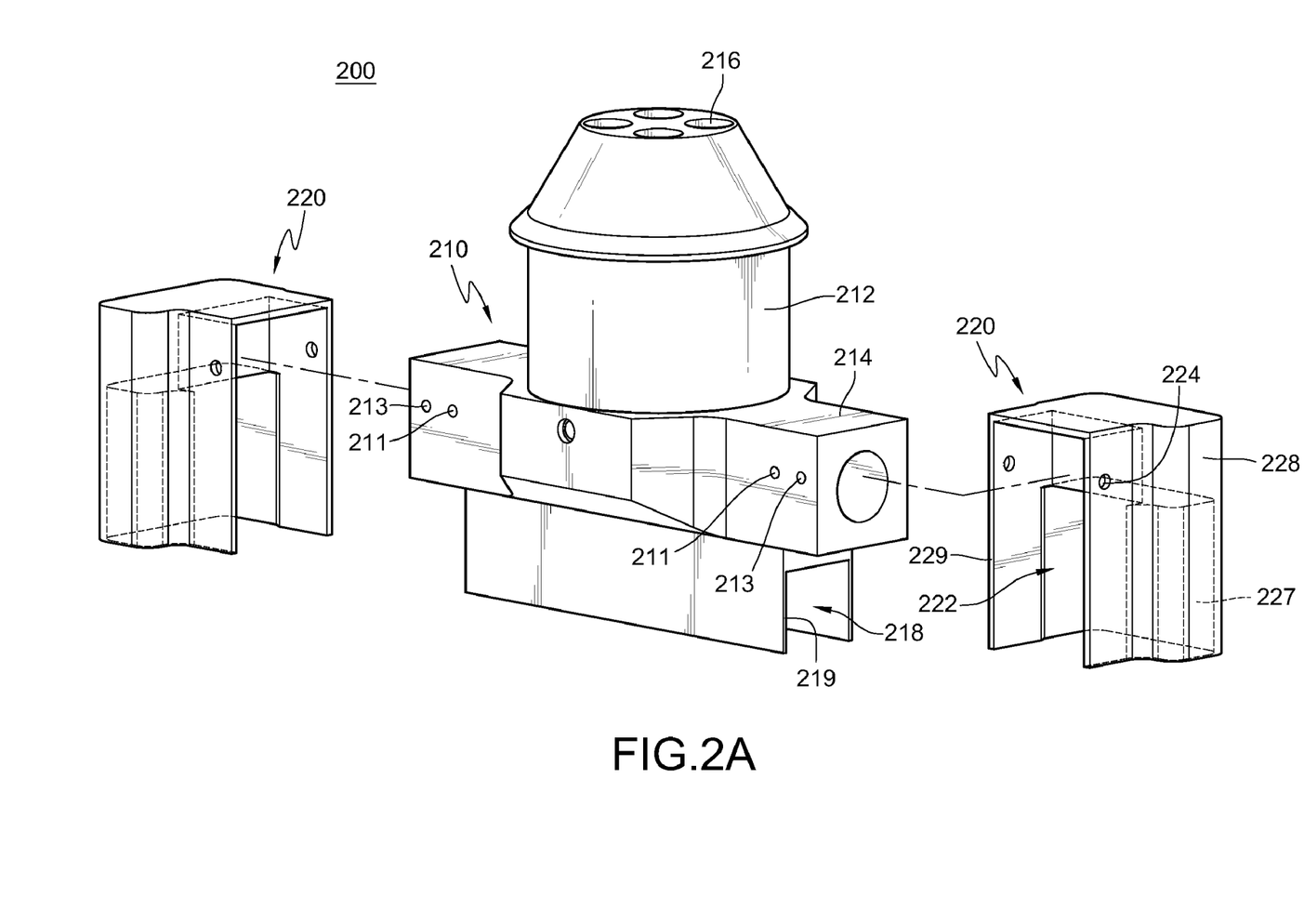
FIG. 2A is a structural view of elements of a rework soldering jig according to a second embodiment of the present invention.
Figure 2B:
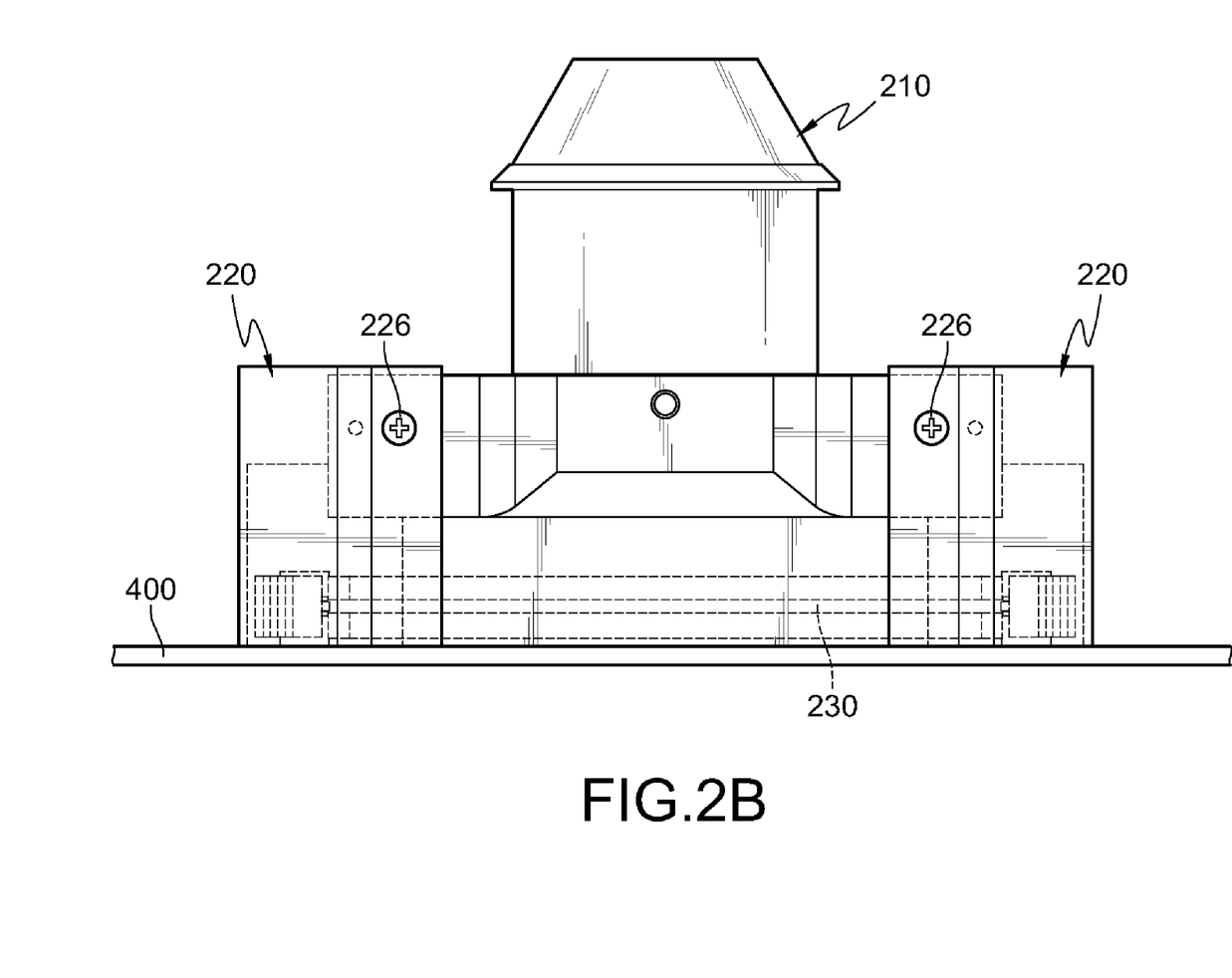
FIG. 2B is a plan assembly view of the rework soldering jig matching a second type of slot according to the second embodiment of the present invention.
Figure 2C:
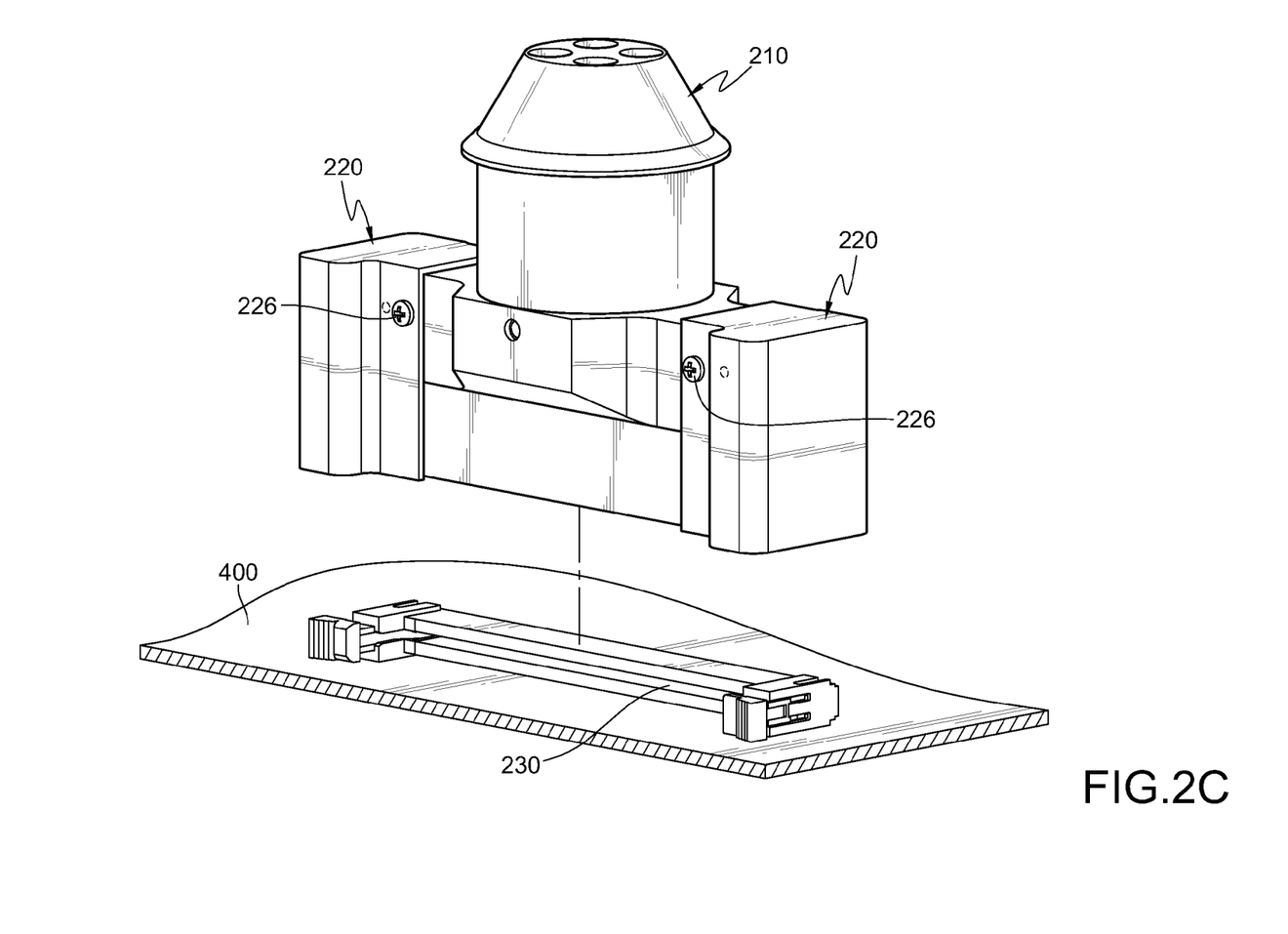
FIG. 2C is a three-dimensional assembly view of the rework soldering jig matching the second type of slot according to the second embodiment of the present invention.

Referring to FIGS. 2A, 2B, and 2C, a fastening member 226, for example, a screw, may pass through the frame assembly hole 224 and the first body assembly hole 211, so that the body 210 and the assembly frame 220 are fastened together, and the assembly frame 220 can be fixed outside the body 210 without falling off. In addition, by assembling and fixing the body 210 and the two assembly frames 220, the body heating tank 218, the frame heating tank 222, and the expansion tank 227 form a combination tank which can match a length×width size and a form of the second type of slot 230, so that the second type of slot 230 is exactly wrapped by the body heating tank 218, the frame heating tank 222, and the expansion tank 227 together. At this time, the hot air stream heats the second type of slot 230 to remove the second type of slot 230 from the circuit board 400.

Figure 2D:
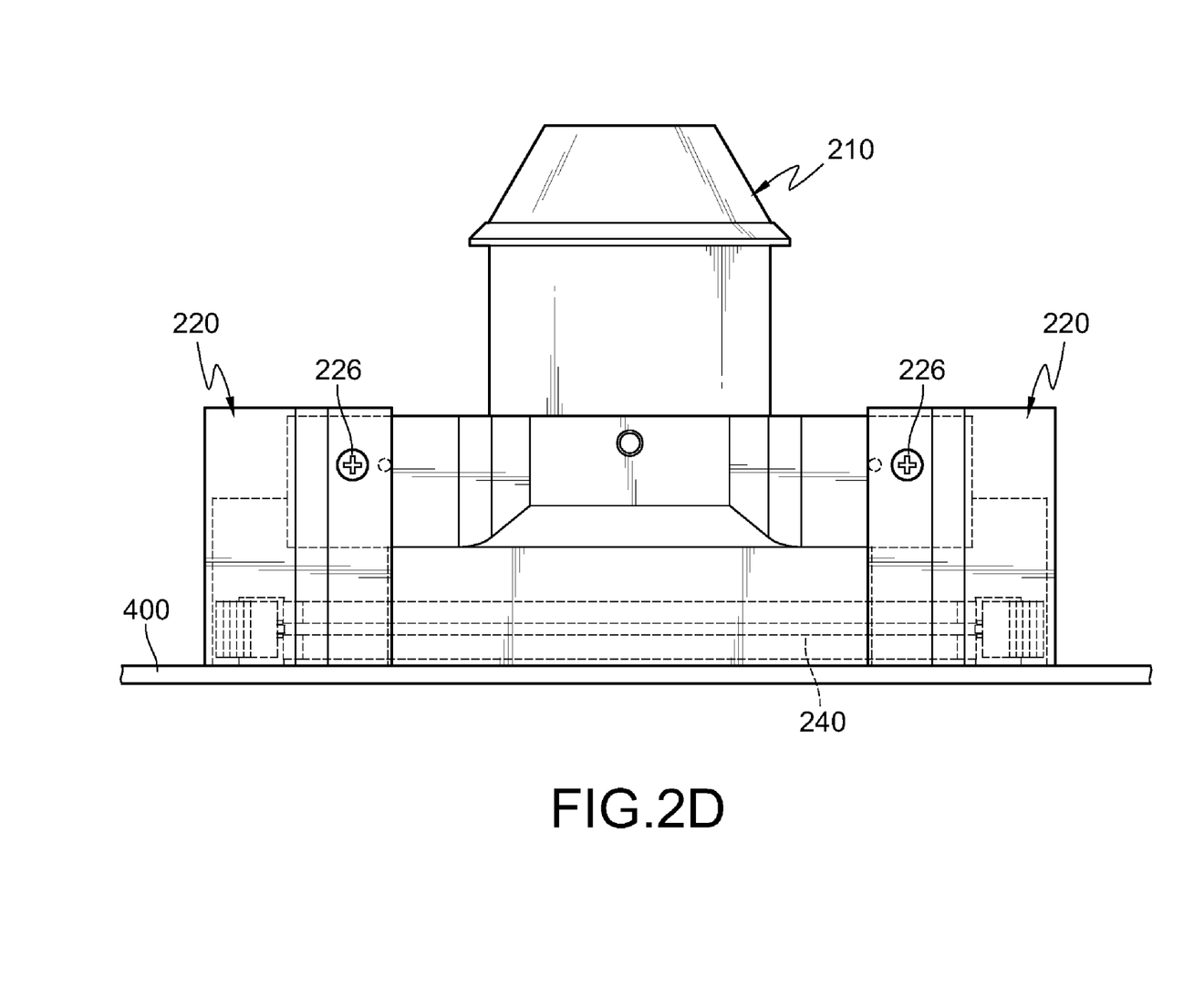
FIG. 2D is a plan assembly view of the rework soldering jig matching a third type of slot according to the second embodiment of the present invention.
Figure 2E:
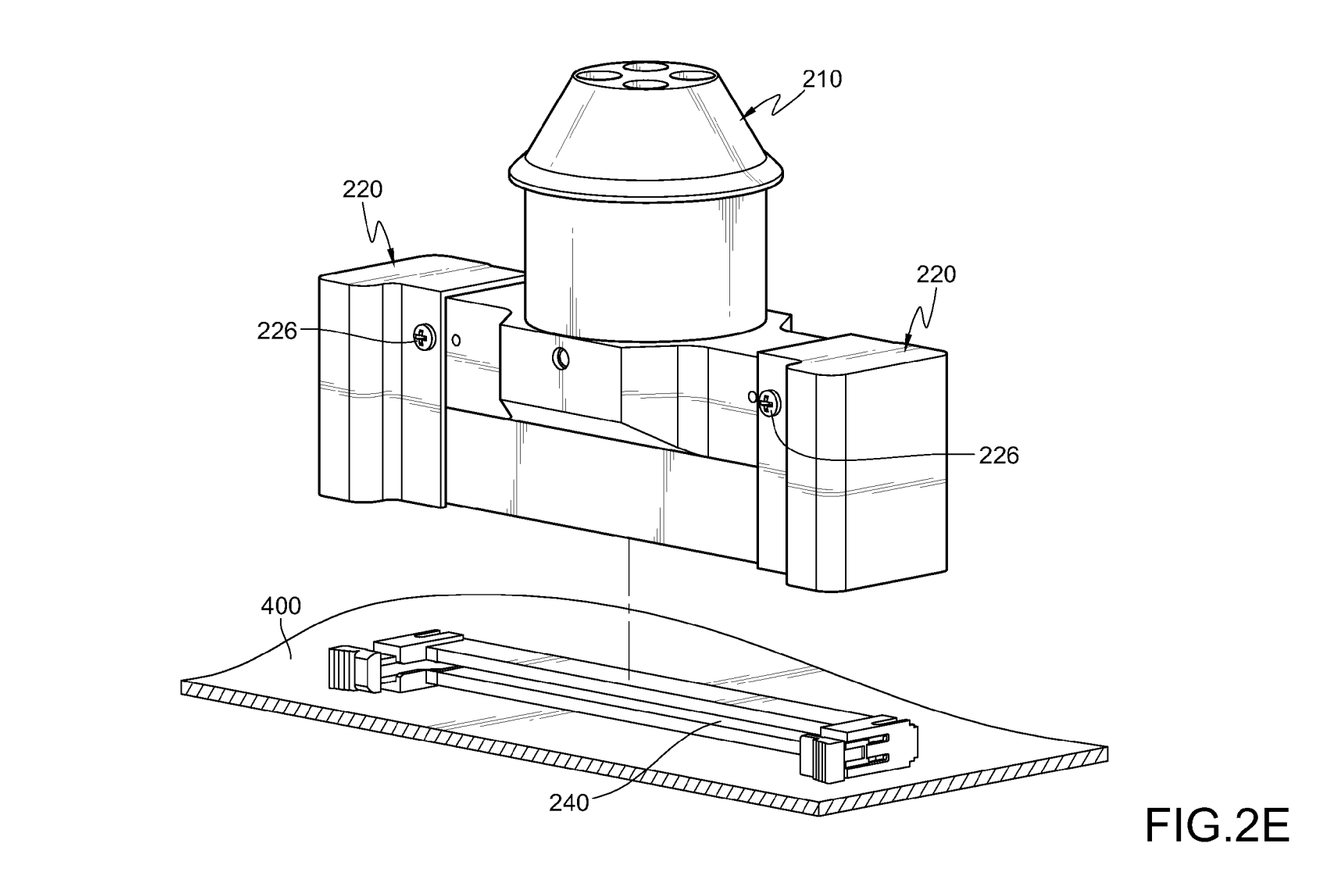
FIG. 2E is a three-dimensional assembly view of the rework soldering jig matching the third type of slot according to the second embodiment of the present invention.

In addition, referring to FIGS. 2A, 2D, and 2E, a fastening member 226, for example, a screw, may also pass through the frame assembly hole 224 and the second body assembly hole 213, so that the body 210 and the assembly frame 220 are fastened together, and the assembly frame 220 can be fixed outside the body 210 without falling off. In addition, by assembling and fixing the body 210 and the two assembly frames 220, the body heating tank 218, the frame heating tank 222, and the expansion tank 227 form a combination tank which can match a length×width size and a form of the third type of slot 240, so that the third type of slot 240 is wrapped by the heating tank 218, the frame heating tank 222, and the expansion tank 227 together. At this time, the hot air stream heats the third type of slot 240 to remove the third type of slot 240 from the circuit board 400.

FIGS. 3A to 3E are a structural view of elements and assembly views of a rework soldering jig 300 according to a third embodiment of the present invention. In this embodiment, the rework soldering jig 300 matching a fourth type of slot 330 and a fifth type of slot 340 respectively is taken as an example for illustration. The third embodiment is similar to the first embodiment in structure, and thus differences in structure will be described in detail. The fourth type of slot 330 and the fifth type of slot 340 are small vertical surface mounted slots, and the fifth type of slot 340 is longer than the fourth type of slot 330.

The rework soldering jig 300 comprises a body 310 and a pair of assembly frames 320. The body 310 has a body heating tank 318 for wrapping the fourth type of slot 330 or the fifth type of slot 340, and the body heating tank 318 is in communication with an air inlet 316.

The assembly frame 320 has a frame heating tank 322 for wrapping the fourth type of slot 330 or the fifth type of slot 340, and the body heating tank 318 and the frame heating tank 322 are in communication with each other.

A body assembly hole 311 may further be opened on the body 310, a first frame assembly hole 324 and a second frame assembly hole 325 arranged horizontally are also opened on the assembly frame 320, and the body assembly hole 311 may match the first frame assembly hole 324 and the second frame assembly hole 325 respectively. In addition, the body 310 has an end face 319, the assembly frame 320 has an outer frame 329, and a size of the outer frame 329 of the assembly frame 320 is smaller than that of the end face 319 of the body 310, so that the two assembly frames 320 can be wrapped by two ends of the body 310.

Figure 3A:
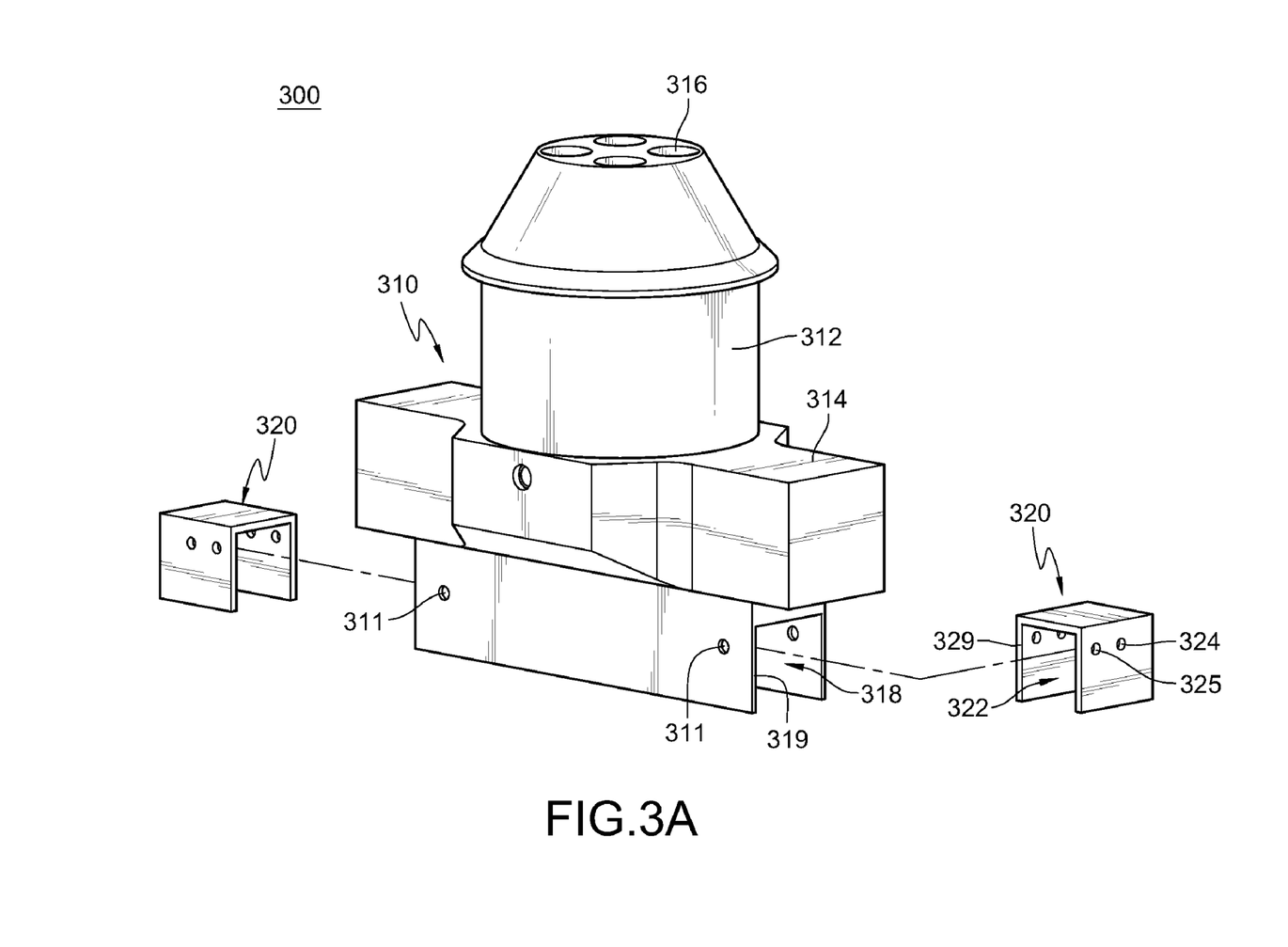
FIG. 3A is a structural view of elements of a rework soldering jig according to a third embodiment of the present invention.
Figure 3B:
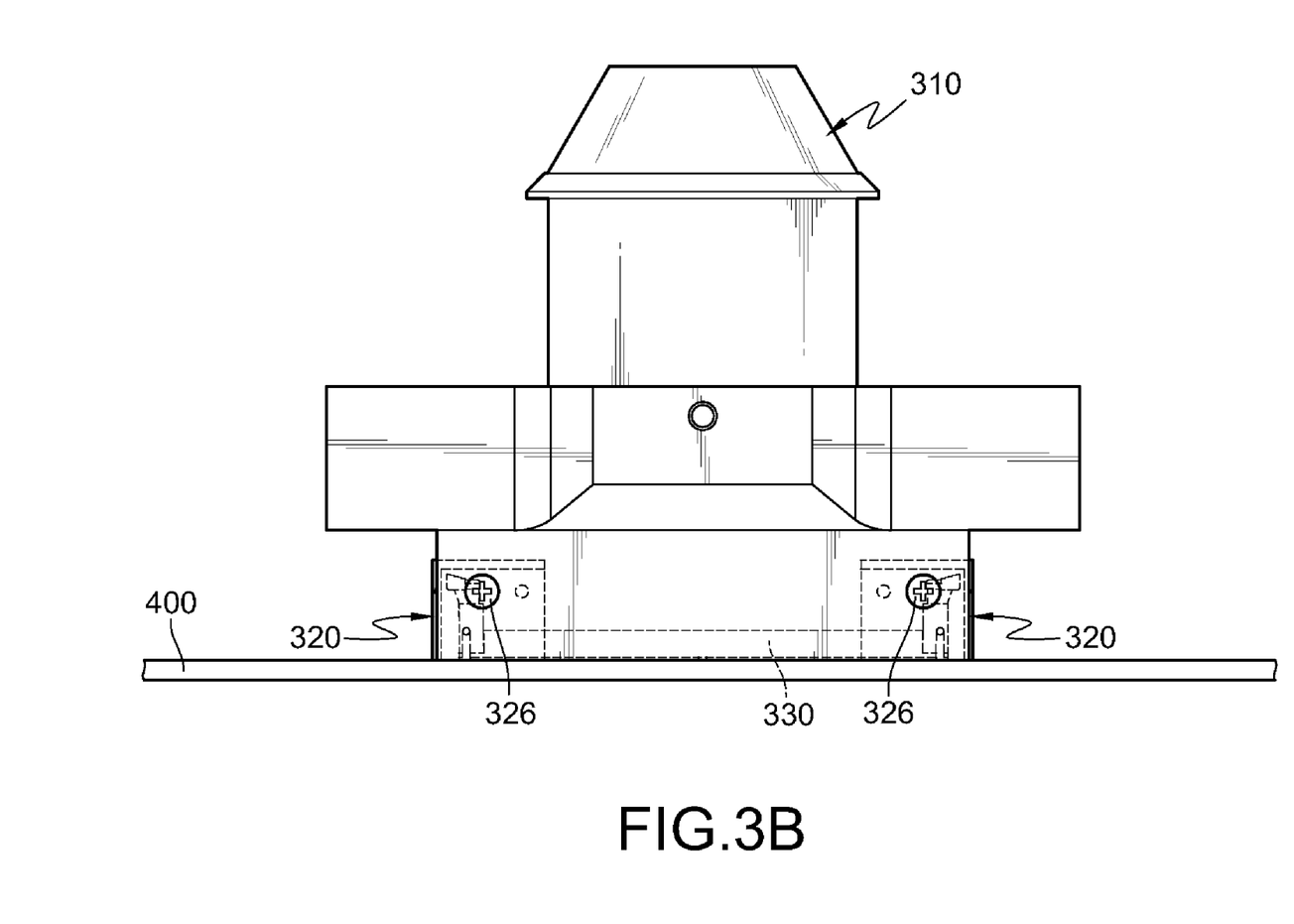
FIG. 3B is a plan assembly view of the rework soldering jig matching a fourth type of slot according to the third embodiment of the present invention.
Figure 3C:
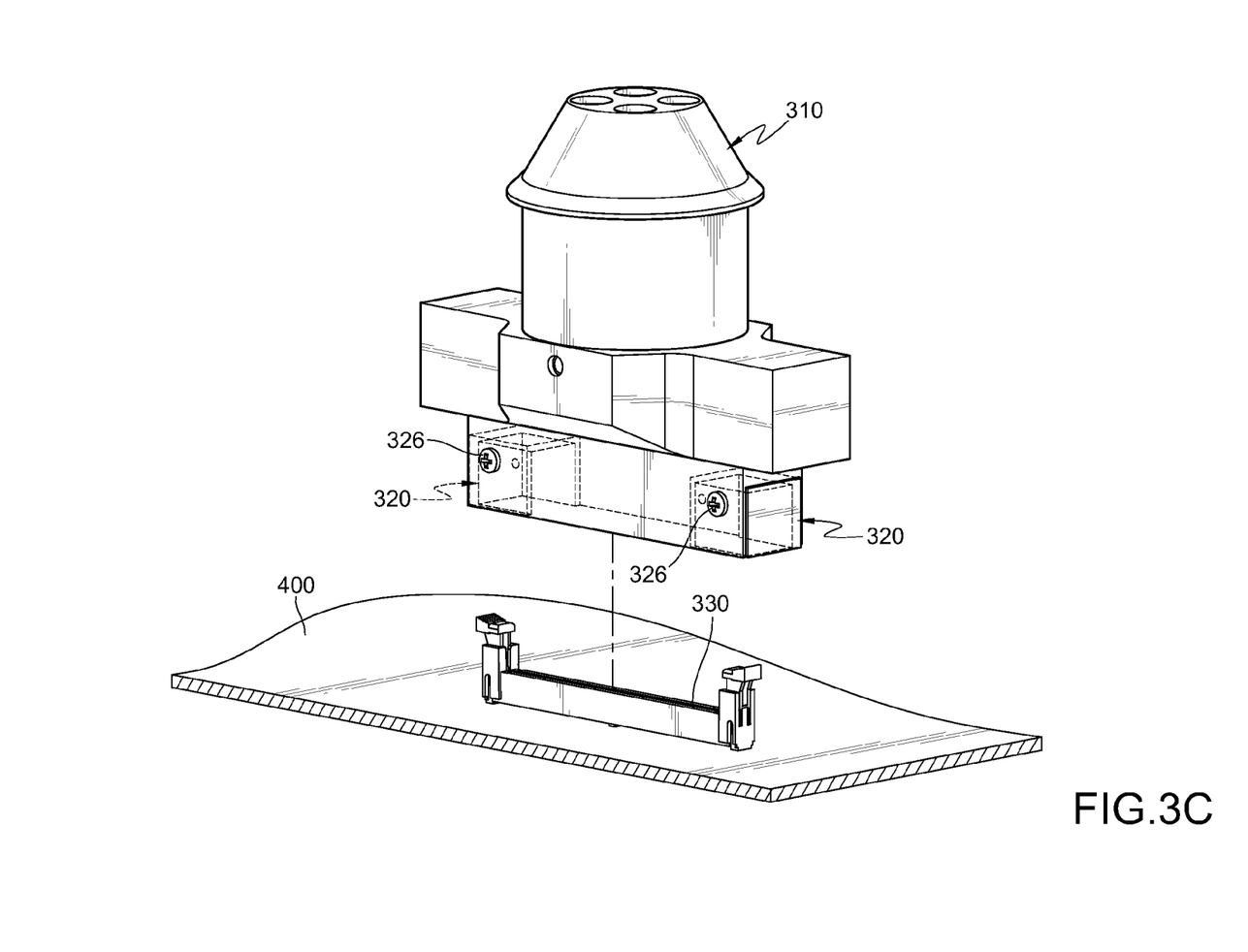
FIG. 3C is a three-dimensional assembly view of the rework soldering jig matching the fourth type of slot according to the third embodiment of the present invention.

Then, referring to FIGS. 3A, 3B, and 3C, a fastening member 326, for example, a screw, may pass through the body assembly hole 311 and the first frame assembly hole 324, so that the body 310 and the assembly frame 320 are fastened together, and the assembly frame 320 can be fixed inside the body 310 without falling off. In addition, by assembling and fixing the body 310 and the two assembly frames 320, the body heating tank 318 and the frame heating tank 322 form a combination tank which can match a length×width size and a form of the fourth type of slot 330, so that the fourth type of slot 330 is exactly wrapped by the body heating tank 318 and the frame heating tank 322 together. At this time, the hot air stream heats the fourth type of slot 330 to remove the fourth type of slot 330 from the circuit board 400.

Figure 3D:
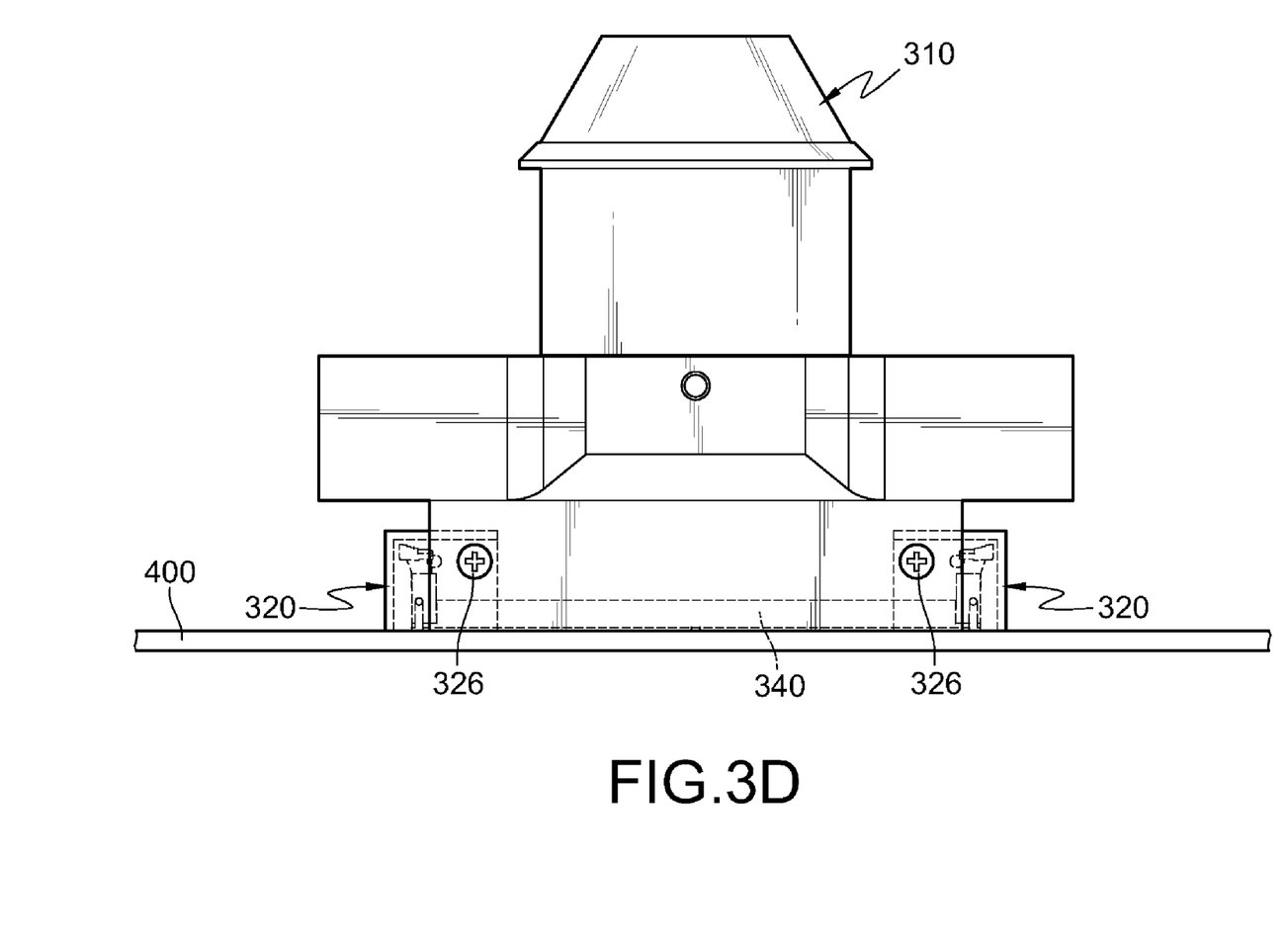
FIG. 3D is a plan assembly view of the rework soldering jig matching a fifth type of slot according to the third embodiment of the present invention.
Figure 3E:
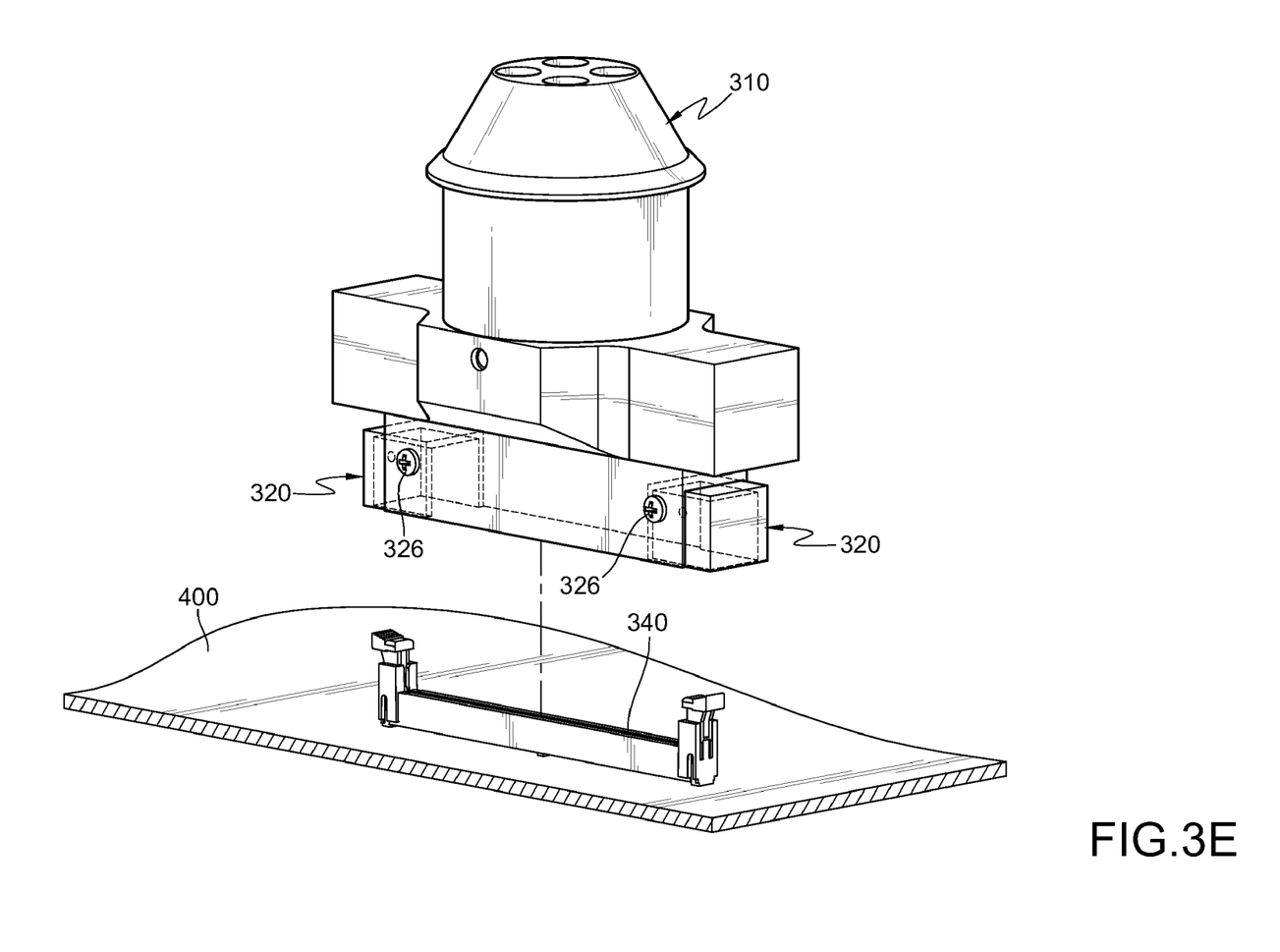
FIG. 3E is a three-dimensional assembly view of the rework soldering jig matching the fifth type of slot according to the third embodiment of the present invention.

In addition, referring to FIGS. 3A, 3D, and 3E, a fastening member 326, for example, a screw, may also pass through the body assembly hole 311 and the second frame assembly hole 325, so that the body 310 and the assembly frame 320 are fastened together, and the assembly frame 320 can be fixed inside the body 310 without falling off. In addition, by assembling and fixing the body 310 and the two assembly frames 320, the body heating tank 318 and the frame heating tank 322 form a combination tank which can match a length×width size and a form of the fifth type of slot 340, so that the fifth type of slot 340 is exactly wrapped by the body heating tank 318 and the frame heating tank 322 together. At this time, the hot air stream heats the fifth type of slot 340 to remove the fifth type of slot 340 from the circuit board 400.

As can be known from the first embodiment to the third embodiment of the present invention, through matching of different forms of assembly frames and different numbers of body assembly holes and frame assembly holes, multiple shapes of heating tanks can be combined, thereby satisfying use requirements for surface mounted slots having different shapes.

It should be noted that, the present invention merely discloses three embodiments for illustration, and the forms of the assembly frames and the numbers and positions of the body assembly holes and the frame assembly holes in the embodiments are not intended to limit the present invention. Persons skilled in the art can match the forms of the assembly frames and the numbers and positions of the body assembly holes and the frame assembly holes of the rework soldering jigs alternately according to practical requirements.

According to the above embodiments, assembly frames having different sizes and forms can be freely assembled or dissembled on the body of the rework soldering jig according to the present invention, thereby changing the shape of the combination tank formed by the body heating tank and the outer frame heating tank after combination. Therefore, surface mounted slots having various forms and sizes can be indeed matched and completely wrapped, thereby greatly improving the rework efficiency.

The present invention does not need to produce multiple sets of rework soldering jigs corresponding to surface mounted slots having various different specifications and sizes, so as to decrease a fabrication rate of the rework soldering jigs, thereby reducing the fabrication cost of the rework soldering jigs and meanwhile solving a problem that conventional rework soldering jigs occupy too much storage space.

What is claimed is:

1. A rework soldering jig, for heating a surface mounted slot with a hot air stream, so as to remove the surface mounted slot from a circuit board, comprising:
   a body, having an air inlet pipe and an air outlet plate, wherein the air inlet pipe has at least one air inlet, the hot air stream enters through the air inlet, the air outlet plate is connected to the air inlet pipe and has a run-through body heating tank, and the body heating tank is disposed on an other side edge opposite to the air inlet pipe and in communication with the air inlet, so that the hot air stream is blown from the body heating tank to the surface mounted slot; and
   at least one assembly frame, detachably disposed on the body and having a run-through frame heating tank, wherein the frame heating tank and the body heating tank are in communication with each other;
   wherein the body heating tank and the frame heating tank together wrap the surface mounted slot.

2. The rework soldering jig according to claim 1, further having two assembly frames respectively disposed at two opposite ends of the body heating tank.

3. The rework soldering jig according to claim 1, wherein the body has a body assembly hole, the assembly frame has a frame assembly hole, and a fastening member passes through the frame assembly hole and the body assembly hole to fix the body and the assembly frame to each other.

4. The rework soldering jig according to claim 1, wherein the body has a plurality of body assembly holes, the assembly frame has a frame assembly hole, and a fastening member passes through the frame assembly hole and one of the body assembly holes to fix the body and the assembly frame to each other.

5. The rework soldering jig according to claim 1, wherein the body has a body assembly hole, the assembly frame has a plurality of frame assembly holes, and a fastening member passes through the body assembly hole and one of the frame assembly holes to fix the body and the assembly frame to each other.

6. The rework soldering jig according to claim 1, wherein a size of an outer frame of the assembly frame is larger than that of an end face of the body, so that the assembly frame is installed outside the body.

7. The rework soldering jig according to claim 1, wherein a size of an outer frame of the assembly frame is smaller than that of an end face of the body, so that the assembly frame is accommodated inside the body.

8. The rework soldering jig according to claim 1, wherein the assembly frame further has an expansion portion, the expansion portion further has an expansion tank in communication with the frame heating tank, and the body heating tank, the frame heating tank, and the expansion tank together wrap the surface mounted slot.

* * * * *